United States Patent
Oishei et al.

(10) Patent No.: US 8,332,790 B1
(45) Date of Patent: Dec. 11, 2012

(54) CAPACITIVE DECOUPLING METHOD AND MODULE

(75) Inventors: Andrew E. Oishei, San Diego, CA (US); Gregory Moore, San Diego, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 12/878,940

(22) Filed: Sep. 9, 2010

Related U.S. Application Data

(62) Division of application No. 11/749,423, filed on May 16, 2007, now Pat. No. 7,818,704.

(51) Int. Cl.
*G06F 17/50* (2006.01)

(52) U.S. Cl. ......... 716/111; 716/106; 716/115; 703/16

(58) Field of Classification Search .......... 716/106, 716/111, 115; 703/16
See application file for complete search history.

(56) References Cited

U.S. PATENT DOCUMENTS

| | | | |
|---|---|---|---|
| 6,477,694 B1* | 11/2002 | Irino et al. | 716/115 |
| 6,519,741 B2* | 2/2003 | Yaguchi et al. | 716/115 |
| 6,532,439 B2* | 3/2003 | Anderson et al. | 703/14 |
| 6,539,527 B2* | 3/2003 | Naffziger et al. | 716/115 |
| 6,546,528 B1* | 4/2003 | Sasaki et al. | 716/115 |
| 6,550,037 B2* | 4/2003 | Ando et al. | 716/110 |
| 6,675,118 B2* | 1/2004 | Wanek et al. | 702/117 |
| 6,789,241 B2* | 9/2004 | Anderson et al. | 716/115 |
| 7,047,515 B1* | 5/2006 | Vitek et al. | 716/115 |
| 7,120,893 B2* | 10/2006 | Sasaki et al. | 716/115 |
| 7,203,921 B2* | 4/2007 | Ishikawa et al. | 716/115 |
| 7,278,124 B2* | 10/2007 | Shimazaki et al. | 716/115 |
| 7,490,306 B2* | 2/2009 | Nguyen et al. | 716/115 |
| 7,689,962 B2* | 3/2010 | Suaya et al. | 716/122 |
| 7,802,220 B1* | 9/2010 | Popovich et al. | 716/120 |
| 2001/0014963 A1* | 8/2001 | Ando et al. | 716/1 |
| 2002/0120906 A1* | 8/2002 | Xia et al. | 716/2 |
| 2002/0174408 A1* | 11/2002 | Naffziger et al. | 716/5 |
| 2003/0084415 A1* | 5/2003 | Sasaki et al. | 716/4 |
| 2004/0073880 A1* | 4/2004 | Yoshida et al. | 716/8 |
| 2004/0088661 A1* | 5/2004 | Anderson et al. | 716/5 |
| 2004/0168142 A1* | 8/2004 | Ishikawa et al. | 716/10 |
| 2004/0216063 A1* | 10/2004 | Dickey et al. | 716/7 |
| 2005/0149894 A1* | 7/2005 | Shimazaki et al. | 716/5 |
| 2006/0022678 A1* | 2/2006 | Hegazy et al. | 324/525 |
| 2006/0123366 A1* | 6/2006 | Ogawa | 716/5 |
| 2007/0226659 A1* | 9/2007 | Suaya et al. | 716/1 |
| 2007/0234245 A1* | 10/2007 | Nguyen et al. | 716/4 |
| 2010/0131906 A1* | 5/2010 | Wyland | 716/3 |
| 2010/0251191 A1* | 9/2010 | Suaya et al. | 716/4 |

FOREIGN PATENT DOCUMENTS

JP 2001167139 A * 6/2001

* cited by examiner

*Primary Examiner* — Phallaka Kik
(74) *Attorney, Agent, or Firm* — Womble Carlyle Sandridge & Rice, LLP

(57) ABSTRACT

The present invention is directed to a capacitive decoupling module and method for an integrated circuit that features providing multiple capacitive elements to decouple the power rails from the integrated circuit. The multiple capacitive elements are spaced-apart, along a first direction, from the integrated circuit. A first set of capacitive elements is closer to the integrated circuit than a second set of capacitive elements. The first set has a smaller capacitance than the second set.

20 Claims, 1 Drawing Sheet

US 8,332,790 B1

CAPACITIVE DECOUPLING METHOD AND MODULE

CLAIM OF PRIORITY

This application is a divisional application of U.S. patent application Ser. No. 11/749,423, filed on May 16, 2007 now U.S. Pat. No. 7,818,704, the disclosure of which is incorporated in its entirety herein by reference.

BACKGROUND

The present invention relates to voltage supply stabilization and, in particular, to a decoupling capacitor arrangement for integrated circuit devices that incorporate the decoupling capacitor arrangement, and to methods of manufacturing the foregoing.

An integrated circuit (IC) is often incorporated in electronic subassemblies by mounting the same to a printed circuit board (PCB) to facilitate input-output I/O connections thereto. To that end, PCBs have electrically conductive traces electrically connected to I/O pads of the IC. I/O signals that propagate along the I/O connections include address, control or data signals, power and ground. Characterized by high frequency operational speeds, ICs operate so as to minimize signal noise.

One manner by which to minimize signal noise is to minimize bias voltage fluctuations, which may result from, inter alia, varying loads on a power supply employed to bias the IC. Varying loads may result from operational characteristics of the IC, such as switching circuitry. This may result in a lower operational frequency of the IC compared to the operational frequency of the same IC in the presence of a voltage supply having less or no fluctuations in the voltage provided to the IC.

One manner in which to stabilize the voltage level provided to an IC by a power supply is to use a decoupling capacitor. As is well known, a decoupling capacitor is connected between a supply voltage line and the reference for the supply voltage line, typically ground. The connection is typically located proximate to the switching load, which in the present discussion is the IC. The result is that the capacitor periodically charges and discharges so that the IC draws full current at normal voltage from the power supply to attenuate the reduction in voltage supplied during operation. Drawbacks of decoupling capacitors are that the foot print of the same limits the layout configuration on the PCB and slows manufacturing throughput. In addition, the operational benefits of decoupling capacitors are reduced due to the foot print of the same, because it is difficult to minimize the distance between the decoupling connection and the IC.

A need exists, therefore, to provide improved decoupling techniques for integrated circuits.

SUMMARY

It should be appreciated that the present invention can be implemented in numerous ways, such as a process and an assembly. Several inventive embodiments of the present invention are described below.

The present invention is directed to a decoupling capacitor module and method that features providing multiple capacitive elements to decouple the power rails from an integrated circuit in electrical communication with the module. The multiple capacitive elements are spaced-apart, along a first direction, from the integrated circuit. A first set of capacitive elements is closer to the integrated circuit than a second set of capacitive elements. The first set has a smaller capacitance than the second set.

These and other aspects of the invention will become apparent from the following detailed description, taken in conjunction with the accompanying drawings, illustrating by way of example the principles of the invention.

DETAILED DESCRIPTION OF THE INVENTION

Figure 1:
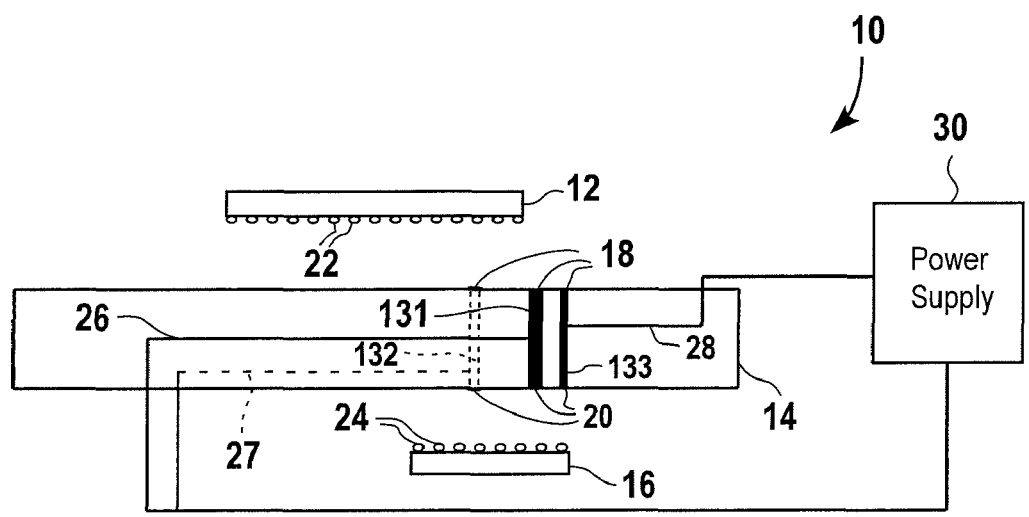
FIG. 1 is a simplified cross-sectional view of an integrated circuit assembly in accordance to one embodiment of the present invention.

Referring to FIG. 1, the present invention is implemented in an integrated circuit assembly 10 that includes an integrated circuit 12, a substrate 14 and a decoupling capacitor module (DCM) 16. Substrate 14 is typically formed from printed circuit board (PCB) material. Integrated circuit 12 may be any known in the art, an example of which is a field programmable gate array (FPGA) manufactured by Altera Corporation of San Jose, Calif. and sold under the tradename STRATIX®. Integrated circuit 12 is attached to bonding sites 18 disposed on one side of substrate 14 using standard techniques. DCM 16 is attached to bonding sites 20 of substrate 14 using standard techniques. As shown, ball grid array (BGA) bonding techniques are employed to attach integrated circuit 12 with substrate 14 to place both in electrical communication in one another. To that end, a plurality of balls 22, typically formed from electrically conductive solder, are attached to bonding pads (not shown) of integrated circuit 12. However, balls 22 may just as well be attached to bonding sites 18 of substrate 14 so long as upon reaching a final seating position, balls 22 provide an electrical connection between bonding sites 18 and integrated circuit 12. DCM 16 is placed in electrical communication with bonding sites 20 in a similar fashion. To that end, DCM 16 includes a plurality of solder balls 24 that, upon DCM 16 reaching a final seating position with respect to substrate 14, place bonding sites 20 in electrical communication with DCM 16.

Substrate 14 includes a plurality of electrically conductive paths, shown as 26, 27 and 28. Each electrically conductive path 26, 27 and 28 may be used for a variety of electrical connections between integrated circuit 12 and circuitry external to both DCM 16 and integrated circuit, referred to as an external circuit. An example of an external circuit is shown as a power supply 30 that may provide electrically conductive paths 26 and 27 with a voltage potential, referred to as a power rail. Electrically conductive path 28 may be held at ground potential. Although only two power rails are shown as 26 and 27, in practice there are a much greater number of power rails, dependent upon the design of assembly 10 and integrated circuit 12.

Electrically conductive throughways 131, 132 and 133, facilitate electrical communication between bonding sides 18 and 20 with power rails 26 and 27 and electrically conductive path 28 and, therefore, power supply 30. In the present example, electrically conductive path 26 is placed in electrical communication with a first pair of bonding sites 18 and 20 vis-à-vis electrically conductive throughway 131, and power rail 27 is placed in electrical communication with a second pair of bonding sites 18 and 20 vis-à-vis electrically conductive throughway 132, with the understanding that both power rail 27 and throughway 132 are shown in dashed lines to demonstrate that the same are in a portion of substrate 14 that does not lie in the plane of the page upon which FIG. 1 is shown. Electrically conductive path 28 is placed in electrical communication with a third pair of bonding sites 18 and 20 vis-à-vis electrically conductive throughway 133.

During operation, integrated circuit 12 is powered by external circuitry 30 providing voltage vis-à-vis by power rails 26 and 27. The load on external circuitry 30 typically varies during operation of integrated circuit 12 due to various operational characteristics, including the range of frequencies of operation of integrated circuit 12, as well as varying current consumption requirements of the same. The change in load on external circuitry 30 may result in changes in voltage present on power rails 26 and 27 that may degrade operation of integrated circuit 12, such as signal noise and slower than desired operation speed. DCM 16 provides the requisite decoupling of power rails, such as power rail 26, to attenuate voltage fluctuations during operation of integrated circuit 12, i.e., DCM 16 stabilizes the voltage level provided to integrated circuit 12.

Figure 2:
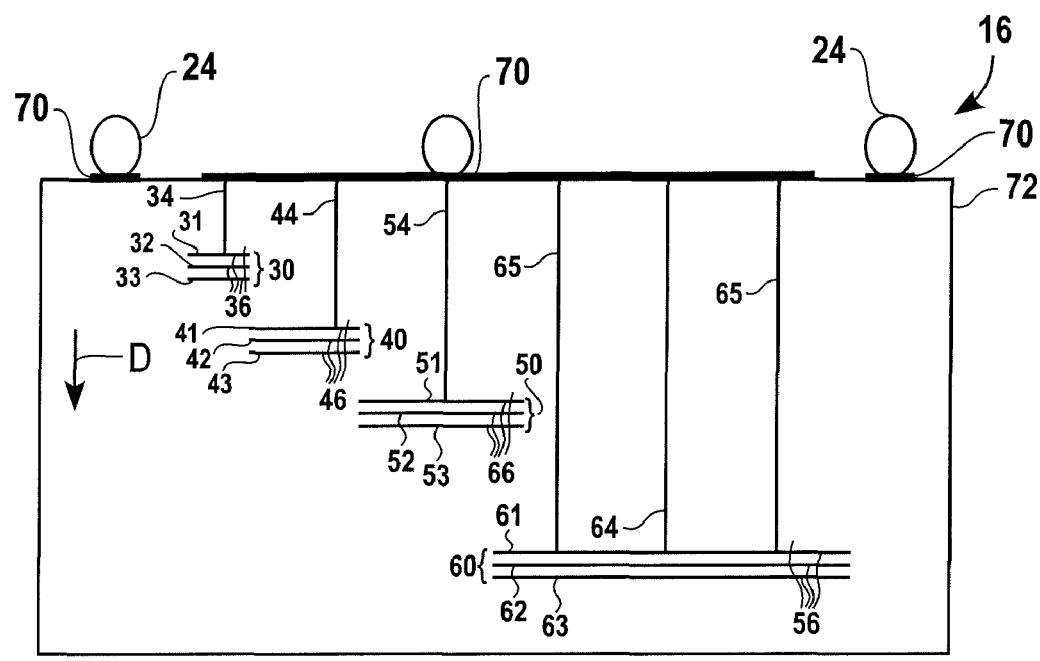
FIG. 2 a detailed plan view of a decoupling capacitor module showing capacitive elements for decoupling one of the power rails, shown in FIG. 1 in accordance with the present invention.

Referring to both FIGS. 1 and 2, to attenuate voltage fluctuations DCM 16 includes multiple capacitive elements for each power rail 26 and 27, four of which are shown as 30, 40, 50 and 60. Although four capacitive elements are shown the number present in DCM 16 is dependent upon many interdependent variables, such as the size of assembly 10, the size of DCM 16 and the number and pitch of bonding sites 20 of substrate 14, just to name a few.

For purposes of the present discussion DCM 16 is described with respect to decoupling power rail 26, with the understanding that the discussion applies equally to power rail 27. As shown each capacitive element 30, 40, 50 and 60 includes multiple electrically conductive layers spaced-apart along a first direction, D. Specifically, capacitive element 30 includes electrically conductive layers 31-33, capacitive element 40 includes electrically conductive layers 41-43; capacitive element 50 includes electrically conductive layers 51-53; and capacitive element 60 includes electrically conductive layers 61-63. Each of layers 31-33 is coextensive with the remaining layers 31-33 of capacitive element 30. Similarly, each of layers 41-43 is coextensive with the remaining layers 41-43 of capacitive element 40; each of layers 51-53 is coextensive with the remaining layers 51-53 of capacitive element 50; and each of layers 61-63 is coextensive with the remaining layers 61-63 of capacitive element 60. Extending from each capacitive element 30, 40, 50 and 60 is an electrically conductive via, shown as 34, 44, 54 and 64, respectively. Electrically conductive vias 34, 44, 54 and 64 place capacitive elements 30, 40, 50 and 60 in electrical communications with connection pads 70 disposed on one side of DCM 16. In this manner, one of solder balls 24 may be placed in electrical communication with electrically conductive throughway 131 and, therefore, power rail 26. Electrically conductive elements may be isolated from the remaining power rails, e.g., power rail 27 included in circuit assembly 10. It should be understood that may more vias may be coupled to each of capacitive elements 30, 40, 50 and 60, shown by vias 65. In the present form, a body 72 of DCM 16 is fabricated from a dielectric material that results in regions 36 adjacent to layers 31-33 and regions 46 adjacent to layers 41-43 being formed from dielectric material, as are region 56 adjacent to layers 51-53 and regions 66 adjacent to layers 61-63. Capacitive elements 30, 40, 50 and 60 are formed to have different capacitances that result from different characteristics of the material from which the same are formed and/or the relative dimensions of the same.

The capacitance of capacitive elements 30, 40, 50 and 60 is determined by identifying a target impedance for each power rail, which in the present example is with respect to power rail 26. A capacitance value for each of capacitive elements 30, 40, 50 and 60 is developed to obtain the desired target impedance based upon the operational characteristics of integrated circuit 12. This may be achieved employing the Early Power Estimator (EPE) available from Altera Corporation of San Jose, Calif. to calculate the total maximum current consumption for integrated circuit 12 based upon concurrently applying voltage to each power rail, e.g., 26 and 27.

The operational characteristics of integrated circuit 12 are then considered when determining the target impedance for each power rail, in this example power rail 26. For example, it may be that integrated circuit 12 includes ten power rails one of which includes power rail 26 that corresponds to rail identifier J, shown as follows:

TABLE 1

| Rail Identifier | Voltage | Current Amps | Total Current | Ripple Current | % Ripple | Ripple (mV) | Target impedance |
|---|---|---|---|---|---|---|---|
| A | 1.8 | 0.77 | 1.186 | 0.59 | 5% | 90 | 0.152 |
| B | 2.5 | 0.2 | 0.4 | 0.20 | 5% | 125 | 0.625 |
| C | 3.3 | 0.05 | 0.05 | 0.03 | 5% | 165 | 6.600 |
| D | 1.2 | 0.591 | 0.125 | 0.06 | 4% | 48 | 0.768 |
| E | 1.2 | 0.746 | 0.303 | 0.15 | 4% | 48 | 0.317 |
| F | 1.5 | 0.303 | 0.303 | 0.15 | 4% | 60 | 0.396 |
| G | 3.3 | 0.125 | 0.125 | 0.06 | 4% | 132 | 2.112 |
| H | 1.2 | 1.722 | 1.722 | 0.86 | 4% | 48 | 0.056 |
| I | 1.2 | 0.5 | 0.5 | 0.25 | 4% | 48 | 0.192 |
| J | 1.2 | 7 |  | 3.50 | 4% | 48 | 0.014 |

As shown rail J has a maximum current drawn at seven amps. In this example, one operational characteristic may be that the voltage applied to rail J not deviate more than 50 mV during a maximum transient current of 7 amps. As a result, a 4% ripple, or voltage, deviation is maintained on rail J. Thus, only a 50 mV deviation is permitted on rail J. From this information the target impedance is determined from the following equation:

$$1.)\ Z_{TARGET} = \left[\frac{(\text{RAIL\_VOLTAGE})(\%\ \text{VOLTAGE\_DEVIATION})}{\text{MAX\_TRANSIENT\_CURRENT}}\right]$$

After determining $Z_{TARGET}$ from equation 1, the following equation is employed to solve for C, the value for each capacitive element 30, 40, 50, 60 coupled to power rail J:

$$2.)\ |Z(\omega)| = \sqrt{\left(\left[\frac{ESR}{n}\right]^2 + \left[\left(\frac{\omega(ESL)}{n}\right) - \left(\frac{1}{n\omega C}\right)\right]^2\right)}$$

where ESR is the equivalent series resistance of the capacitive element for which C is being determined; ESL is the equivalent series inductance of the same, n= is the number of capacitive elements coupled in parallel to the power rail, in this example power rail ten, having the same values of C, ESL and ESR. The variable w is the frequency in radians defined by the well known following equation:

$$\omega = 2\pi f \qquad 3.)$$

where f is the frequency at which integrated circuit 12 operates. As a result, angular frequency is derived from a range of frequencies ranging from 10 kHz to the maximum operating frequency of integrated circuit 12, $f_{max}$.

As stated above, the capacitance value, C, is determined for each capacitive element coupled to a power rail. For the example reflected by Table 1, and assuming an operational frequency of 250 MHz, values for capacitive elements, for one of power rails, in this example power rail 26, may be generated as follows:

TABLE 2

| Rail Identifier | Cap Value | Number of Parallel Capacitive elements | ESR (ohm) | ESL (nH) | Mounting Inductance (nH) | Total Inductance (nH) |
|---|---|---|---|---|---|---|
| A | 1.5 nF | 3 | 0.221 | 0.48 | 0.6 | 1.08 |
| B | 0.01 uF | 7 | 0.09 | 0.49 | 0.6 | 1.09 |
| C | 0.1 uF | 4 | 0.034 | 0.43 | 0.6 | 1.03 |
| D | 22 nF | 6 | 0.083 | 0.49 | 0.6 | 1.09 |
| E | 47 nF | 2 | 0.02 | 0.46 | 0.6 | 1.06 |
| F | 100 uF | 4 | 0.08 | 2.22 | 0.6 | 2.82 |
| G | 220 nF | 2 | 0.007 | 0.4 | 0.6 | 1 |
| H | 470 nF | 4 | 0.02 | 0.42 | 0.6 | 1.02 |
| I | 2.2 uF | 5 | 0.16 | 0.46 | 0.6 | 1.06 |
| J | 3.3 uF | 4 | 0.097 | 0.4 | 0.6 | 1 |

After determining appropriate capacitances for each power rail, capacitive elements are generated for all power rails. It should be understood that the value of capacitive elements 30, 40, 50 and 60 are established so as to provide the capacitances necessary to reduce the impedance as seen by IC 12 to its respect rail voltage, in this example the voltage of power rail 26. This is achieved, in part, by establishing the capacitances of capacitive elements 30, 40, 50 and 60 that compensate for the equivalent series inductance of the capacitive element, vias 34, 44, 54 and 64, respectively, and assembly 10.

Additionally, the relative spatial arrangement of capacitive elements 30, 40, 50 and 60 is selected to further reduce the inductance presented by DCM 16. For example, the location of bonding connections on DCM 16 and, therefore via routing density of DCM 16 often constrain the location orientation of capacitive elements 30, 40, 50 and 60 to be located at different distances from integrated circuit 12. The greater the distance between capacitive elements 30, 40, 50 and 60, the greater the inductance presented, referred to as spatial proximity inductance (SPI).

One manner in which to attenuate SPI is by arranging capacitive elements 30, 40, 50 and 60 within DCM 16 so that lower frequency capacitive elements 30, 40, 50 and 60 are placed further from integrated circuit 12 than higher frequency capacitive elements. This ensures that the capacitive elements having the greater effective radius are placed further from integrated circuit 12 than capacitive elements having a less effective radius. As shown, capacitive element 60 has the largest electrically conductive plates 61-63 providing the same with the largest capacitance among capacitive elements 30, 40, 50 and 60, on the order of micro-farads. Thus, capacitive element 60 is the capacitive element tuned to the lowest operational frequency of integrated circuit 12 to provide the desired decoupling characteristics based upon the target impedance identified from equation 1. Capacitive element 30 has the smallest electrically conductive plates 31-33 providing the same with the smallest capacitance on among capacitive elements 30, 40, 50 and 60, a value of the order of nano-farads or pico-farads. Thus, capacitive element 30 is the capacitive element tuned to the highest operational frequency of integrated circuit 12 to provide the desired decoupling characteristics based upon the target impedance identified from equation 1. Due to capacitive element 30 having the smallest effective radius of capacitive elements 30, 40, 50 and 60, the same is placed closest to integrated circuit 12. It should be understood that the capacitive value of capacitive element 40 is greater than capacitive element 30 and less than both capacitive elements 50 and 60. As a result, capacitive element 40 is located further from IC 12 than capacitive element 30 and closer to IC 12 than both capacitive elements 50 and 60. Capacitive element 60 has the greatest effective radius and is placed furthest away from IC 12 than the remaining capacitors 30, 40 and 50. Arranging capacitors 30, 40, 50 and 60 in this manner minimizes SPI, as well as the inductance attributed to vias 34, 44, 54 and 64, referred to as via inductance (VI).

Although the foregoing invention has been described in some detail for purposes of clarity of understanding, it will be apparent that certain changes and modifications may be practiced within the scope of the appended claims. Accordingly, the present embodiments described above are to be considered as illustrative and not restrictive, and the invention is not to be limited to the details given herein, but may be defined by the appended claims, including full scope of equivalents thereof.

What is claimed is:

1. A method of determining capacitance of a capacitive element coupled to a power rail, said method comprising:
   determining a range of frequencies at which an integrated circuit operates, said integrated circuit coupled to said power rail;
   ascertaining changes in current and voltage propagating on said power rail for operation of said integrated circuit over said range of frequencies;
   identifying a target impedance for said power rail based upon said changes in current and voltage; and
   establishing said capacitance based upon said target impedance for said power rail, wherein at least one method operation is executed through a processor.

2. The method as recited in claim 1 wherein identifying further includes identifying said target impedance while said integrated circuit operates at maximum current consumption.

3. The method as recited in claim 1 wherein determining further includes determining a maximum operational frequency of said integrated circuit, with said range of frequencies being from said maximum operational frequency to approximately 10 kHz.

4. The method as recited in claim 1 further including providing a plurality of power rails and a plurality of multiple electrically conductive elements, each of which is coupled between one of said plurality of power rails and ground, with identifying further including identifying said target impedance for each of said plurality of power rails and, for each of said plurality of power rails, establishing a capacitance of each of a plurality of capacitive elements coupled to said one of said plurality of power rails based upon said target impedance of said one of said plurality of power rails.

5. The method as recited in claim 4 wherein identifying further includes obtaining a maximum operational current drawn across each power rail of said plurality of power rails, with identifying further including identifying said target impedance based upon a maximum operational current drawn.

6. The method as recited in claim 4 wherein each capacitive element of said plurality of capacitive elements has an effective radius associated therewith, and said method further including locating said plurality of capacitive elements with respect to said integrated circuit spaced-apart a distance along a first direction, with said distance being less than said effective radius.

7. The method as recited in claim 4 further including locating said plurality of capacitive elements so as to be spaced-apart a distance, along a first direction, from said integrated circuit, with a first set of capacitive elements being closer to said integrated circuit than a second set of capacitive elements, said first set having a smaller capacitance than said second set.

8. The method as recited in claim 4 wherein the plurality of capacitive elements has different capacitances resulting from a plurality of characteristics and dimensions from which each of the capacitive elements is formed.

9. The method as recited in claim 4 wherein said target impedance for each power rail of said plurality of power rails is based on a plurality of operational characteristics of said integrated circuit.

10. The method as recited in claim 4 wherein establishing the capacitance of said each of said plurality of capacitive elements includes compensating for an inductance of said each of said plurality of capacitive elements and an associated electrically conductive via.

11. The method as recited in claim 4 further including arranging the plurality of capacitive elements so that lower frequency capacitive elements are placed at a greater distance from said integrated circuit than higher frequency capacitive elements.

12. The method as recited in claim 11 wherein each of said plurality of capacitive elements is arranged to reduce a spatial proximity inductance.

13. The method as recited in claim 11 wherein each of said plurality of capacitive elements is arranged to reduce both a spatial proximity inductance and an inductance of a plurality of associated electrically conductive vias.

14. The method as recited in claim 4 further comprising disposing each of said plurality of capacitive elements and said integrated circuit on opposed surfaces of a substrate.

15. A method of determining a decoupling capacitor arrangement for a proximately located integrated circuit on a substrate, the decoupling capacitor having a plurality of capacitive elements to decouple a plurality of power rails from the integrated circuit, the method comprising:
   determining a range of frequencies at which the integrated circuit operates;
   determining changes in current and voltage propagating on each power rail of the plurality of power rails for operation of the integrated circuit over the range of frequencies;
   identifying a target impedance for said each power rail of the plurality of power rails based upon a plurality of operational characteristics of said integrated circuit including said determined changes;
   determining a capacitance for each capacitive element of the plurality of capacitive elements based upon the target impedance for said each power rail of the plurality of power rails; and
   arranging, using a processor, placement of the plurality of capacitive elements on the substrate based on the determined capacitance for said each capacitive element of the plurality of capacitive elements, wherein said each capacitive element of the plurality of capacitive elements is coupled in parallel to said each power rail of the plurality of power rails.

16. The method as recited in claim 15 further comprising disposing the plurality of capacitive elements and the integrated circuit on opposed surfaces of the substrate.

17. The method as recited in claim 15 wherein said each capacitive element of the plurality of capacitive elements is arranged to reduce both a spatial proximity inductance and an inductance of a plurality of associated electrically conductive vias.

18. The method as recited in claim 15 wherein said each capacitive element of the plurality of capacitive elements is arranged in order of a corresponding capacitance value wherein a capacitive element having a lowest capacitance value is located closest to the integrated circuit, and a capacitive element having a highest capacitance value is located farthest from the integrated circuit.

19. The method as recited in claim 15 wherein identifying further includes identifying the target impedance while the integrated circuit operates at a maximum operational current drawn.

20. The method as recited in claim 15 wherein determining the range of frequencies further includes determining a maximum operational frequency of the integrated circuit, with the range of frequencies being from the maximum operational frequency to approximately 10 kHz.

* * * * *